United States Patent [19]

Buckner et al.

[11] Patent Number: 4,517,880
[45] Date of Patent: May 21, 1985

[54] FAN MOUNTING ASSEMBLY

[75] Inventors: Arthur B. Buckner, West Valley City; Michael L. Davies, American Fork; Lawrence W. Weber, Bountiful, all of Utah

[73] Assignee: Sperry Corporation, New York, N.Y.

[21] Appl. No.: 561,493

[22] Filed: Dec. 14, 1983

[51] Int. Cl.³ .............................................. F24F 13/00
[52] U.S. Cl. ........................................ 98/1; 248/27.3; 248/674
[58] Field of Search ............... 248/27.1, 27.3, DIG. 6, 248/674, 221.4, 316.7; 361/379, 384; 417/361; 98/1

[56] References Cited

U.S. PATENT DOCUMENTS

| | | | |
|---|---|---|---|
| 2,557,223 | 6/1951 | Hans | 248/674 X |
| 2,734,441 | 2/1956 | Williams | 98/1 |
| 2,873,082 | 2/1959 | Gillespie | 248/316.7 X |
| 4,139,755 | 2/1979 | Hastings et al. | 248/27.1 X |
| 4,327,398 | 4/1982 | Christison | 361/384 |

*Primary Examiner*—Harold Joyce
*Attorney, Agent, or Firm*—John B. Sowell; Kenneth T. Grace; Marshall M. Truex

[57] ABSTRACT

A flexible moulded plastic panel closure is provided with a plurality of latches and retainers to permit the flexible moulded plastic panel to be attached through an aperture in a rigid wall of a chassis of a video display terminal. The flexible moulded plastic panel is provided with a plurality of resilient retaining fingers and tolerance springs for precisely mounting and holding an axial flow electric fan in a predetermined position to provide circulated air cooling for heat producing electronic components mounted inside of said rigid chassis.

11 Claims, 4 Drawing Figures

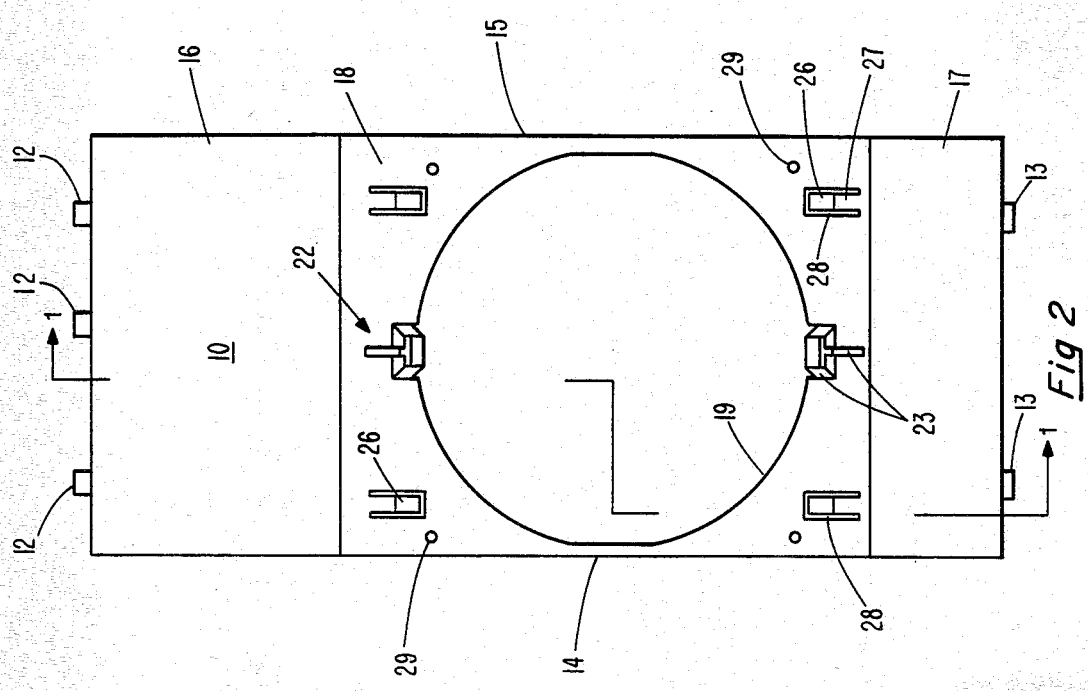
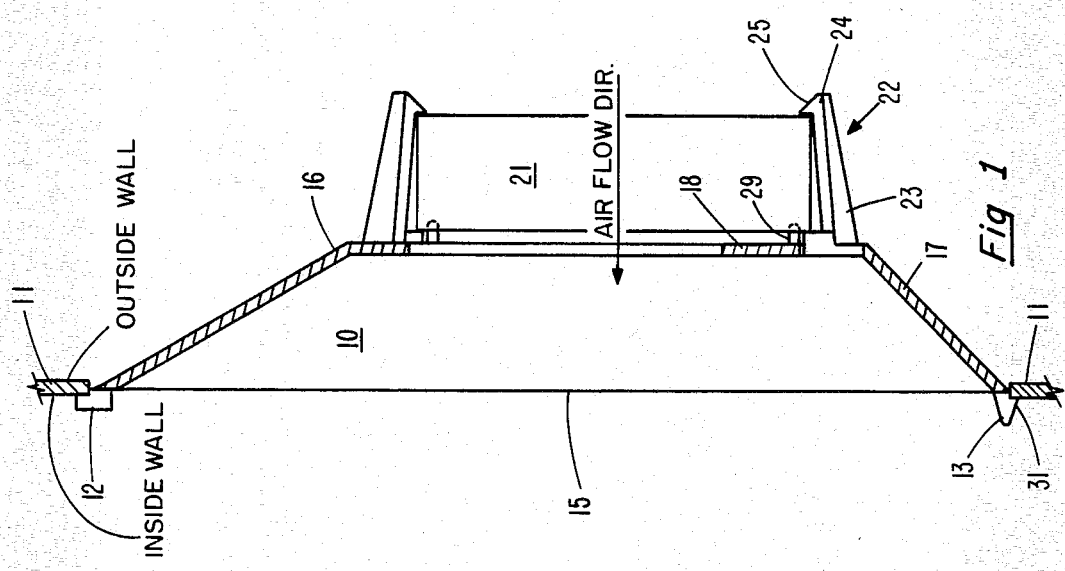

FAN MOUNTING ASSEMBLY

BACKGROUND OF THE INVENTION

1. Field of the Invention

The present invention relates to an improved Fan Mounting Assembly for cooling electronic components. More particularly, the present invention relates to a flexible fan mounting assembly which attaches to a rigid wall or chassis of a video display terminal (VDT) by flexible latches provided on the fan mounting assembly.

2. Description of the Prior Art

Fans employed to cool video display terminals have been standardized for all practical purposes. The commercially available standard fans have heretofore been provided with mounting holes for mounting the fans with screws onto a part of the chassis.

Commercially available kits in the form of structural shapes such as angle brackets are also available for mounting and afixing commercially available cooling fans to the base or sidewalls of the chassis of video display terminals. Such angle brackets and kits that are provided with various shapes and extensions are bolted to both the cooling fan and a portion of the chassis.

Heretofore, it was necessary to provide some form of bolts or screws and attachments and/or brackets with screws and attaching means to mount a cooling fan to the chassis of a VDT. This prior art structure was expensive and required an inordinate amount of time during original assembly and also required an extensive amount of time when any rework or replacement was required.

It would be desirable to mount a standard type cooling fan directly to the rigid wall of a chassis of a video display terminal without the requirement of any hardware type of fastener.

SUMMARY OF THE INVENTION

The principal object of the present invention is to provide a single piece moulded structure for attaching a cooling fan to a rigid wall of a video display terminal chassis.

Another principal object of the present invention is to provide a flexible plastic fan mounting assembly for attaching a cooling fan to a rigid chassis of a video display terminal by resilient latch means.

Another principal object of the present invention is to provide a fan mounting assembly which is cheap to manufacture and easy to install and/or remove.

Another object of the present invention is to provide a fan mounting assembly having novel flexible retaining fingers for holding a cooling fan to the assembly.

Another object of the present invention is to provide novel tolerance adjusting springs for holding a cooling fan to the fan mounting assembly without any looseness.

It is yet another object of the present invention to provide a novel fan mounting and aligning structure which is moulded integrally with the fan mounting assembly.

BRIEF DESCRIPTION OF THE DRAWINGS

FIG. 1 is a side elevation in section made at lines 1—1 of FIG. 2 of the preferred embodiment fan mounting assembly;

FIG. 2 is a front elevation of the fan mounting assembly shown in FIG. 1;

DESCRIPTION OF THE PREFERRED EMBODIMENT

Figure 4:
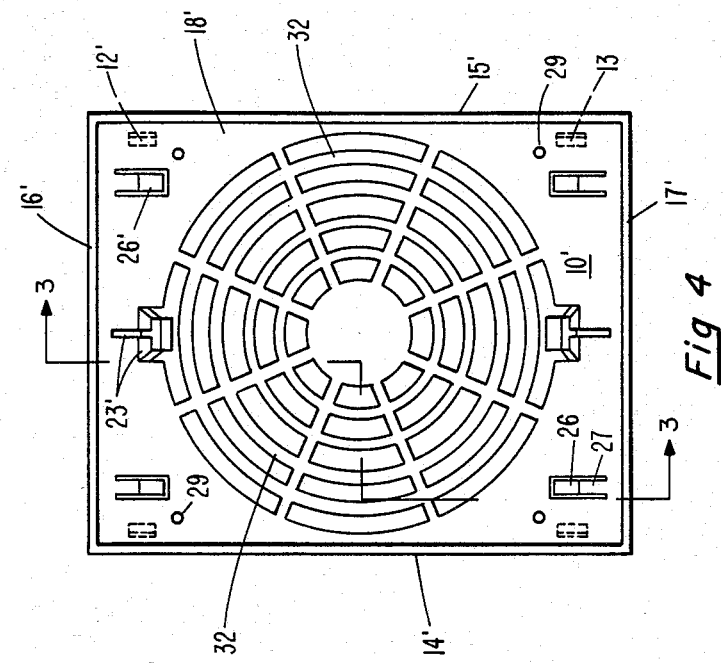
FIG. 4 is a front elevation of the fan mounting assembly shown in FIG. 3.

Refer now to FIGS. 1 and 2 showing a preferred embodiment fan mounting assembly 10 preferably made from flexible moulded plastic as an integral assembly. The assembly 10 fits flush against the outside wall of a rigid vertical wall of a video display terminal chassis 11. Retaining ears 12 extend inwardly and radially outward so as to fit behind the outside wall and engage the inside wall 11 of the VDT chassis. Similarly, the rigid latches 13 are tapered and have a latch shelf which slips through the aperture in the rigid wall of the chassis and engages the inside wall of the chassis 11. The flexible moulded fan mounting assembly 10 is provided with two parallel and vertical sidewalls 14 and 15 which are connected to the top tapered sidewall 16 and the bottom tapered sidewall 17 to form a hollow box. A front wall 18 connects to the four sidewalls 14 to 17 and is further provided with an aperture 19 which is axially aligned with the fan motor 21 shown as a rectangle. The fan motor is a commercially available standard cooling fan of the type made by several vendors such as Rotron, Inc. of Woodstock, New York. The outside dimensions of the fan housing are standard dimensions but have large tolerances or dimensional variances which are standard in this industry.

Resilient retainer fingers 22 are integrally moulded with the front side 18 and are provided with reinforcement ribs 23 which strengthen the finger 22 and cause the front face 18 to flex when the fingers 23 are expanded outwardly over the side edges of the fan motor 21 when the motor 21 is being mounted on the fan mounting assembly 10. The ends of the fingers 22 are provided with latches 24 of the type shown at latch 13. In the preferred embodiment mode of operation, the fan motor 21 is forced against the inner cam surface 25 on the latches 24 so as to expand the fingers 22 outward and permit the fan housing 21 to be moved into engagement with raised pads 26 on tolerance springs 27. The tolerance springs are integrally moulded in the form of cantilevered fingers by virtue of the isolation slots 28 surrounding the fingers 27 on three sides.

Alignment pins 29 are extended outward from the front side 18 and adapted to engaged in the mounting holes provided in the standard fan motor housing 21. The alignment pins are adapted to fit snuggly in these holes which were adapted to accept mounting screws and/or bolts and also form shear support for the fan housing and motor 21. The sides 14 and 15 of the flexible moulded plastic fan mounting assembly 10 mount against the outside wall 11 with its ears and retaining latches 12 and 13 on the inside wall of the chassis. The direction of air flow is through the plenum shaped assembly 10 and operates as a forced draft fan to cool the electronic components which are usually mounted on printed circuit boards on the inside of the chassis (not shown). In the preferred embodiment mode of operation, the ears 12 are first fitted in behind the inside wall of the chassis 11 and the cam surface 31 of the latches 13 are forced against the opening in wall 11 so as to cause the bottom tapered side 17 to flex and permit the latches 13 to snap in behind wall 11. It is possible to mount the motor 21 on the fan assembly 10 before mounting the assembly 10 into the wall 11 of the chassis. Once the assembly 10 has the motor 21 mounted in place and is afixed to the rigid wall 11, the flexible assembly 10 becomes a rigid assembly with an extremely low damping constant.

Figure 3:
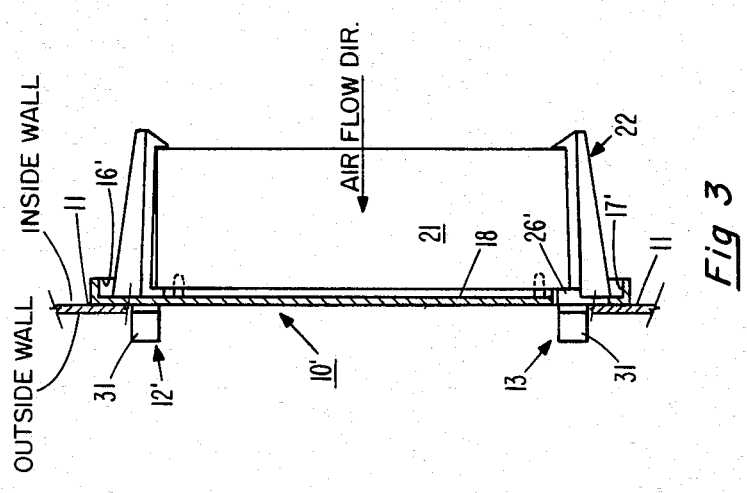
FIG. 3 is a side elevation in section made at lines 3—3 of FIG. 4 of a modified embodiment fan mounting assembly.

Refer now to FIGS. 3 and 4 showing a modified embodiment flexible moulded plastic fan mounting assembly 10'. Retaining ears 12' are modified in that the ears are made in the form of the latches 13 which permits a double camming action when the fan mounting assembly 10' is inserted in the opening in the chassis wall 11. The tolerance springs 27 and resilient retaining fingers 22 are identical to those hereinbefore described with regards to FIGS. 1 and 2 and are numbered the same. The air flow direction shown by the arrow is the same as was described hereinbefore, however, the mounting assembly 10' is now mounted to the inside wall 11 of the chassis as distinguished from the outside wall as shown in FIGS. 1 and 2. Thus, the fan motor 21 is in the compartment with the electronic components to be cooled and operates in a mode of operation which is described as an induced draft fan. Since the area inside the chassis adjacent fan 21 is a work area, a grill 32 is provided as an integral part of the moulded housing and forms an extension of the front side 18'.

Since the fan motor 21 is operating as an induced draft fan, it does not require a plenum effect as described hereinbefore with the open box assembly 10 shown in FIGS. 1 and 2. The vertical sides 14' and 15' are shallow rib shaped members and the tapered top and bottom sides 16 and 17 of FIGS. 1 and 2 are replaced with shallow ribs 16' and 17'.

Having explained a preferred embodiment force draft fan mounting assembly 10 which incorporates a plenum shaped open box in the fan mounting assembly 10, it will be understood that either the preferred embodiment fan mounting assembly 10 can be elongated further to mount two fan motors 21 of the type shown by duplicating the retaining fingers 23, the tolerance springs 27 and the alignment pins 29. Similarly, the modified preferred embodiment induced draft fan flexible moulded plastic mounting assembly 10' may be further modified in the same manner to accomodate two cooling fans 21. Since the standard commercially available fans 21 have a fixed outside dimension and thickness for a range of air displacements from 50 to approximately 125 cubic feet per minute, the mounting assemblies shown are adaptable for large range air displacements and meet the needs of standard commercially available video display terminals where cost and ease of manufacture is a primary consideration.

We claim:

1. An electrical fan mounting assembly for a video display terminal comprising:
    a rigid chassis housing in said video display terminal for mounting heat producing components,
    an aperture in said rigid housing adapted to permit air flow therethrough,
    a flexible moulded plastic panel assembly,
    said plastic panel assembly comprising,
    a box shaped panel having four sides, at least two sides being substantially parallel vertical sides connected to a front side to form a shallow open box therewith,
    an aperture in said front side of said box shaped panel adapted to align with said aperture in said rigid chassis housing,
    an axial flow electric fan mounted over said aperture in said front side of said box shaped panel,
    tolerance springs formed in the front side of said flexible plastic closure adapted to resiliently support said axial flow electric fan thereon,
    a plurality of resilient retainer fingers extended outward from said front side of said panel,
    a latch on the end of each said resilient finger adapted to snap over the outside of said electric fan motor and to hold said electric fan in engagement with said tolerance springs,
    a plurality of retaining ears extending rearward and outward from the top of said open box shape panel adapted to engage the rear surface of a rigid wall of said chassis housing of said video display terminal at said aperture, and
    latch means on the bottom side of said open box shape panel extending rearward and outward from the bottom of said open box shape panel and adapted to engage the rear surface of said rigid wall of said chassis housing to rigidly mount said flexible moulded plastic panel on said rigid chassis housing to form a rigid fan mounting assembly therewith.

2. An electrical fan mounting assembly as set forth in claim 1 wherein said four sides of said open box comprise two substantially vertical sides and a pair of top and bottom tapered sides connected to said front side to form a plenum housing therewith.

3. An electrical fan mounting assembly as set forth in claim 2 wherein said axially flow fan is adapted to be mounted as a force draft fan on said electrical fan mounting assembly.

4. An electrical fan mounting assembly as set forth in claim 1 wherein said four sides of said open box shaped panel comprise two pairs of shallow parallel sides connected to said front side to form a flexible fan mounting assembly.

5. An electrical fan mounting assembly as set forth in claim 4 which further includes a finger guard screen moulded integrally with said front side of said fan mounting assembly forming a guard closure over said aperture in said fan mounting assembly.

6. An electrical fan mounting assembly as set forth in claim 4 wherein said axial flow fan is adapted to be mounted as an induced draft fan.

7. An electrical fan mounting assembly as set forth in claim 1 wherein said tolerance springs comprises a plurality of cantilever fingers formed by slots on three sides in the front side of said box shaped panel.

8. An electrical fan mounting assembly as set forth in claim 7 wherein said tolerance springs are provided with raised pads whose height is proportional to the variations in the thickness in said electrical fan.

9. An electrical fan mounting assembly as set forth in claim 7 wherein said tolerance springs comprises three or more cantilevered springs integrally moulded in said front side of said box shaped panel.

10. An electrical fan mounting assembly as set forth in claim 1 which further comprises a plurality of alignment pins extending outward from the front side of said box shaped panel and adapted to align said electric fan on said flexible moulded plastic panel.

11. An electrical fan mounting assembly as set forth in claim 1 wherein said latch means are integrally connected to a flexible side of said open box of said fan mounting assembly.

* * * * *